United States Patent [19]

Van Heelsbergen

[11] Patent Number: 5,347,220
[45] Date of Patent: Sep. 13, 1994

[54] MAGNETIC RESONANCE APPARATUS COMPRISING A BIRD-CAGE RF COIL

[75] Inventor: Teunis R. Van Heelsbergen, Eindhoven, Netherlands

[73] Assignee: U.S. Philips Corporation, New York, N.Y.

[21] Appl. No.: 990,328

[22] Filed: Dec. 9, 1992

[30] Foreign Application Priority Data

Dec. 11, 1991 [EP] European Pat. Off. ........ 91203257.0

[51] Int. Cl.$^5$ ........................................... G01R 33/20
[52] U.S. Cl. .................................. 324/318; 324/322
[58] Field of Search ............... 324/318, 322, 314, 313, 324/300; 335/282, 299, 296; 128/653.5, 653.2

[56] References Cited

U.S. PATENT DOCUMENTS

| | | | |
|---|---|---|---|
| 4,737,718 | 4/1988 | Kemner et al. | 324/322 |
| 4,784,146 | 11/1988 | Mancuso et al. | 324/318 |
| 4,820,985 | 4/1989 | Eash | 324/318 |
| 4,879,516 | 11/1989 | Mehdizadeh et al. | 324/318 |
| 5,045,792 | 9/1991 | Mehdizadeh | 324/318 |

FOREIGN PATENT DOCUMENTS

0141383 10/1984 European Pat. Off. ..... G01N 24/04

Primary Examiner—Michael J. Tokar
Assistant Examiner—Raymond Y. Mah
Attorney, Agent, or Firm—Jack D. Slobod

[57] ABSTRACT

A magnetic resource apparatus includes a mainly cylindrical RF coil (9) having a longitudinal directed central axis (33) and symmetry plane (35) which contains the central axis and a reference plane (37). The reference plane extends perpendicularly to the symmetry plane and also contains the central axis. The coil (9) has a number of rod conductors (39) which extend, parallel to the central axis (33), across a mainly cylindrical surface, and loop conductors (41) which extend around the central axis near the ends of the rod conductors, the length of the rod conductors (39) situated near the symmetry plane (35) being greater than that of the rod conductors situated near the reference plane (37). In order to enable sharp and low-noise images to be made of the neck of a patient, the rod conductors (39) which are situated near the symmetry plane (35) and to one side of the reference plane (37) have a length which is greater than that of the rod conductors situated near the symmetry plane and to the other side of the reference plane.

7 Claims, 2 Drawing Sheets

MAGNETIC RESONANCE APPARATUS COMPRISING A BIRD-CAGE RF COIL

BACKGROUND OF THE INVENTION

1. Field of the Invention

The invention relates to a magnetic resonance apparatus, comprising a mainly cylindrical RF coil having a central axis which extends in its longitudinal direction, which coil has a symmetry plane which contains the central axis and a reference plane which extends perpendicularly to the symmetry plane and which also contains the central axis, and also comprises a number of rod conductors which extend, parallel to the central axis, across a mainly cylindrical surface and loop conductors which extend around the central axis near the ends of the rod conductors, the length of the rod conductors situated near the symmetry plane being greater than that of the rod conductors situated near the reference plane. The invention also relates to an RF coil suitable for use in such an apparatus.

2. Description of the Related Art

An example of such an apparatus is known from EP-A-0 141 383. FIG. 5D of the cited document shows an RF coil, one of the loop conductors of which is circular whereas the other loop conductor is more or less saddle-shaped, so that recesses are formed at one end of the coil. A magnetic resonance apparatus comprising an RF coil of this type is suitable for examination or imaging of the head of a patient by means of magnetic resonance. To this end, the coil can be arranged around the head of a patient, the shoulders of the patient fitting in the recesses so that the coil can enclose the head completely. Except for a window for observation of the face of the patient, provided at one side, the known coil has a four-fold cylindrical symmetry. One or more of the rod conductors are interrupted so as to form said window. The location of the window is chosen so that the interrupted rod conductors carry no or hardly any current during operation of the coil, so that the interruptions hardly influence the symmetry of the coil from an electrical point of view. The cited document explains that an RF coil having four-fold cylindrical symmetry offers a number of advantages, notably because such a coil has two orthogonal resonant modes at the same resonant frequency, enabling quadrature activation or read-out of the coil, both modes being simultaneously excited or received.

It has been found that there is a need for a magnetic resonance apparatus which is suitable for examination of the neck of a patient, that is to say a part of the body which extends from approximately 1 cm above the eyes as far as the third cervical vertebra. An apparatus comprising the known RF coil is not suitable for this purpose, because the coil is only capable of enclosing the head. This problem could in theory be solved by making the recesses for the shoulders deeper, but it has been found that in that case the signal-to-noise ratio of the coil is substantially degraded.

It is an object of the invention to provide a magnetic resonance apparatus of the kind set forth which is particularly suitable for examination of the neck of a patient with an acceptable signal-to-noise ratio. To achieve this, the device in accordance with the invention is characterized in that the rod conductors which are situated near the symmetry plane and to one side of the reference plane have a length which is greater than that of the rod conductors which are situated near the symmetry plane and to the other side of the reference plane.

The invention is based on the recognition of the fact that when the part of the known RF coil which faces the feet of the patient is simply made longer, an RF field will be generated not only at the back side of the patient (at the area of the cervical vertebrae), but also at the area of parts of the patient which need not be imaged, notably at the side of the breast. The latter field, therefore, does not contribute to the acquisition of usefull information concerning the body, but does contribute to the noise of the system, so that the signal-to-noise ratio is adversely affected. The RF coil of the device in accordance with the invention is shaped so that at one side it extends further in the direction of the feet of the patient than at the other side. When the coil is arranged around the head of the patient so that the longest rods are situated at the back side of the patient, these long rods will extend as far as underneath the third cervical vertebra, whereas the shorter rods at the side of the breast will extend only as far as the chin. As a result, a substantial part of the field generated at the breast side of the patient will be situated in the void between the chin and the body. This part of the field does not dissipate and does not contribute noise, so that the signal-to-noise ratio is enhanced. Moreover, as a result of this step the RF coil may be smaller (contain less conductor material), so that the coil losses (copper losses) are also reduced. Thus, again less noise is generated.

The signal-to-noise ratio can be further improved in a preferred embodiment of the device in accordance with the invention which is characterized in that the distance between rod conductors situated diametrically near the reference plane is smaller than the distance between rod conductors situated diametrically near the symmetry plane. This embodiment takes into account the fact that the cross-section of the head is approximately oval, resulting in voids between the coil and the sides of the head when an RF coil having a circular cross-section is used, so that the coil would become unnecessarily large, leading to the described adverse effects for the signal-to-noise ratio. The cross-section of the RF coil in said preferred embodiment is adapted substantially to that of the head.

A potential drawback of the device in accordance with the invention consists in that, due to the abandonment of four-fold symmetry, it is no longer ensured that the coil has two orthogonal resonant modes with the same resonant frequencies. This drawback can be eliminated by a further embodiment of the device in accordance with the invention which is characterized in that at least one capacitive element is connected in series with each rod conductor, the capacitance connected in series with each of the rod conductors near the symmetry plane being greater than the capacitance connected in series with each of the rod conductors near the reference plane. When the values of the capacitances connected in series with the rod conductors, being variable, if desired, are suitably chosen, an approximately equal contribution of the currents in the rods is achieved. As a result, over the major part of its length the coil is electrically equivalent to a coil having four-fold symmetry, so that quadrature read-out is readily possible.

This equivalence does not hold, or only to a small extent, for the end portion of the coil which faces the feet of the patient and which contains rod conductors only at the back side of the patient. Consequently, quadrature operation of the coil is less attractive, notably when measurement takes place in that portion of the RF coil. Therefore, a further embodiment of the device in accordance with the invention is characterized in that there are provided switching means for selectively deactivating the connection between one of the two connection means and the transmitter and/or receiver means. In this embodiment a change-over from the quadrature mode (where both orthogonal resonant modes are excited or received) to a linear mode (where only one resonant mode is active) is readily possible.

BRIEF DESCRIPTION OF THE DRAWING

These and other aspects of the invention will be described in detail hereinafter with reference to the drawing, wherein.

DETAILED DESCRIPTION OF THE PREFERRED EMBODIMENT

Figure 1:
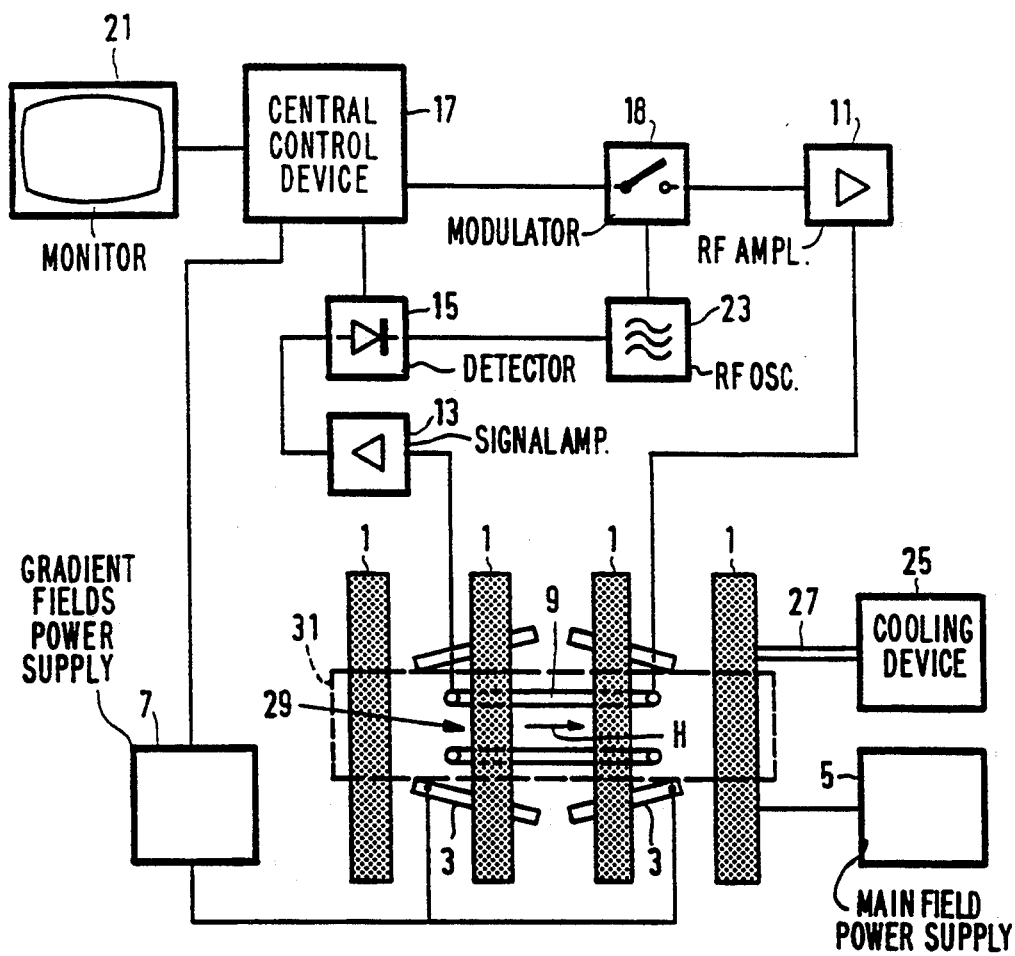
FIG. 1 shows diagrammatically an embodiment of a magnetic resonance apparatus in accordance with the invention.

The magnetic resonance apparatus which is diagrammatically shown in FIG. 1 comprises a first magnet system 1 for generating a steady main magnetic field H, a second magnet system 3 for generating magnetic gradient fields, and first and second power supply sources 5 and 7 for the first magnet system 1 and the second magnet system 3, respectively. A radio-frequency (RF) coil 9 serves to generate an RF magnetic alternating field; to this end, it is connected to the output of an RF amplifier 11. For detection of spin resonance signals generated by the RF transmitted field in an object to be examined (not shown), use can also be made of the RF coil 9; to this end, it is connected to a signal amplifier 13. The output of the signal amplifier 13 is connected to a detector circuit 15 which is connected to a central control device 17. The central control device 17 also controls a modulator 18 feeding the RF amplifier 11, the second power supply source 7 and a monitor 21 for display. An RF oscillator 23 controls the modulator 19 as well as the detector 15 processing the measurement signals. For cooling, if any, of the magnet coils of the first magnet system 1 there is provided a cooling device 25 comprising cooling ducts 27. Such a cooling device may be constructed as a water cooling system for resistive coils or, as for the high field strengths desired in the present case, for example as a liquid helium cooling system for superconducting magnet coils. The RF coil 9, arranged within the magnet systems 1 and 3, encloses a measurement space 29 which is large enough to accommodate a patient to be examined, or a part of a patient to be examined, for example the head and the neck, in an apparatus for medical diagnostic measurements. Thus, a steady magnetic field H, gradient fields selecting object slices, and a spatially uniform RF alternating field can be generated within the measurement space 29. The RF 9 can combine the functions of transmitter coil and receiver coil. Alternatively, different coils can be used for the two functions, for example measuring coils in the form of surface coils. Hereinafter, the RF coil 9 will usually be referred to as the measuring coil. For the use of the coil as a transmitter coil, the same considerations apply in conformity with the reciprocity theorema. If desired, the coil 9 may be enclosed by an RF field shielding Faraday cage 31.

Figure 2A:
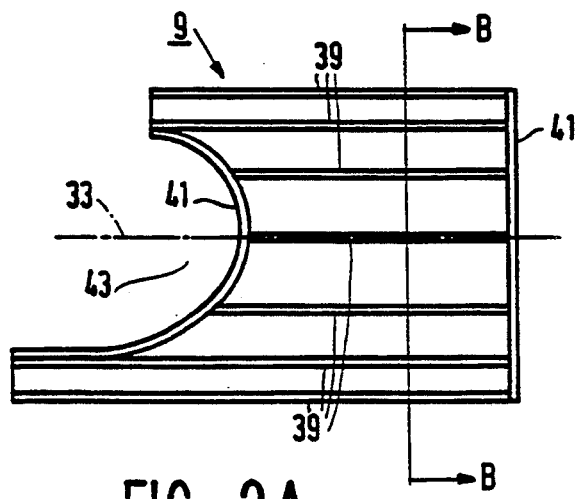
FIG. 2A is a side elevation and FIG. 2B is a cross-sectional view of an embodiment of an RF coil for the apparatus shown in FIG. 1.
Figure 2B:
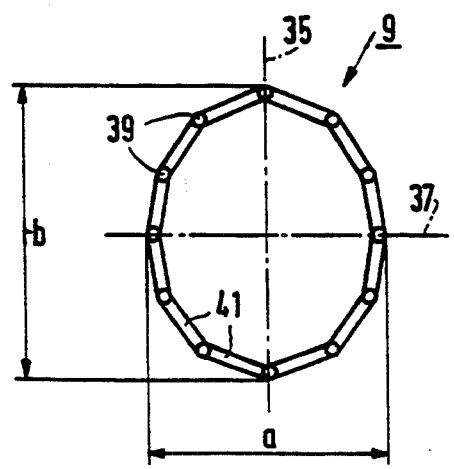

The FIGS. 2A and 2B are a side elevation and a cross-sectional view, respectively, of the RF coil 9 whose shape is chosen so that the coil is particularly suitable for making images of the neck of a patient. The coil has a mainly cylindrical shape with a central axis 33 extending in its longitudinal direction, a symmetry plane 35 containing the central axis, and a reference plane 37 which extends perpendicularly to the symmetry plane and which also contains the central axis. The central axis 33, the symmetry plane 35 and the reference plane 37 are denoted by dash-dot lines in the FIGS. 2A and 2B. The coil 9 is composed of a number (twelve in the example shown) of rod conductors 39 which extend across a mainly cylindrical surface, parallel to the central axis, and loop conductors 41 which extend around the central axis near the ends of the rod conductors. The rod conductors 39 and the loop conductors 41 behave as self-inductances for RF electric currents. In order to ensure that the coil resonates at given frequencies, capacitive elements (not shown in the FIGS. 2A and 2B) are included in the rod conductors 39 and the loop conductors 41.

The length of the rod conductors 39 situated near the symmetry plane 35 is greater than that of the rod conductors situated in the vicinity of the reference plane. One of the loop conductors 41 (the right-hand loop conductor in FIG. 2A) is situated mainly in a fiat plane, the other loop conductor being approximately saddle-shaped, so that a space 43 for the shoulders of the patient is formed at the left-hand end of the coil 9. Moreover, the length of the rod conductors 39 situated in the vicinity of the symmetry plane 35 to one side of the reference plane 37 (the lower side in FIG. 2A) is greater than that of the rod conductors situated to the other side. Consequently, the left-hand end of the coil 9 extends further to the left at the lower side of the reference plane 37 than at the upper side. When, in the position shown in FIG. 2A, the coil 9 is arranged around the head of a patient lying on his back, the coil will extend approximately as far the chin of the patient at the upper side and approximately as far the third cervical vertebra at the lower side. It is thus achieved that on the one hand an image of the entire neck can be formed and that on the other hand substantially no RF field is generated or measured in the breast of the patient. Such a field would not contribute to the useful information for imaging, but would make a contribution to noise. Thanks to the described steps, therefore, the signal-to-noise ratio can be considerably improved.

The signal-to-noise ratio is improved further in that the distance a between the rod conductors 39 situated diametrically near the reference plane 37 is smaller than the distance b between the rod conductors situated diametrically near the symmetry plane. As a result of this step, the coil 9 has a slightly oval cross-section, corresponding to the likewise slightly oval shape of the human head. As a result, hardly any void space will remain between the head and the coil, so that the dimensions of the coil are as small as possible and the amount of conductor material (preferably copper) required for the rod and loop conductors will also be as small as possible. The copper losses are thus reduced for the benefit of the signal-to-noise ratio.

Figure 3:
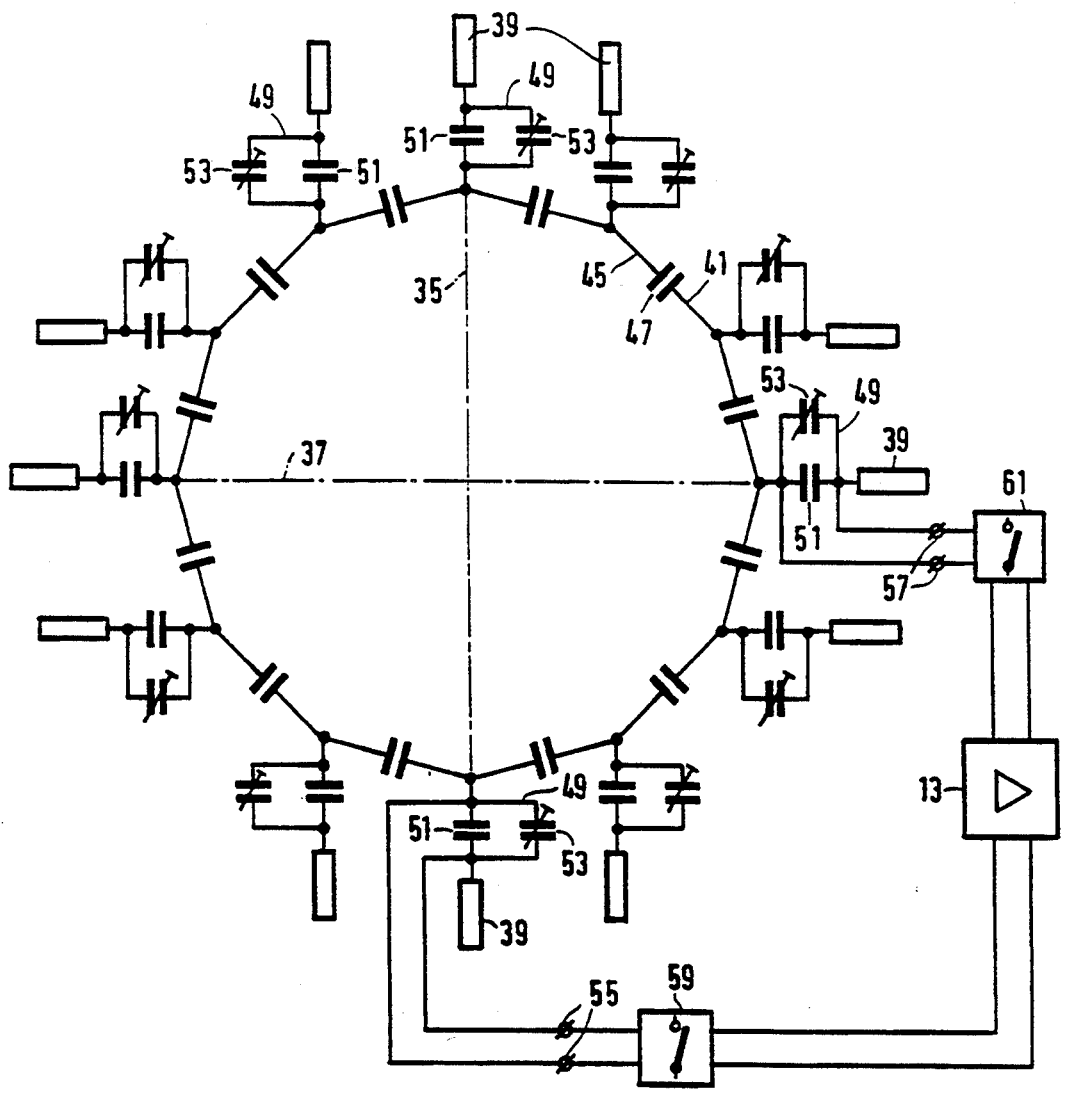
FIG. 3 shows a version of an electrical diagram for the coil shown in FIG. 2.

FIG. 3 shows a version of an electrical diagram of the left-hand loop conductor 41 of FIG. 2A and the adjoining portions of the rod conductors 39. The loop conductor 41 may be constructed, for example as a series connection of electrically conductive portions 45 and capacitive elements, for example capacitors 47. The electrically conductive portions 45 may be, for example tracks on a flexible, electrically insulating support (not shown), a capacitor 47 being soldered between the adjoining ends of every two conductive portions. The rod conductors 39 may be formed by metal rods or tubes. In series with each rod conductor 39 there may also be connected a capacitive element 49 which consists of a parallel connection of a fixed capacitor 51 and a variable capacitor 53 in the present embodiment. A suitable choice of the values of the capacitive elements 49 enables the contributions of the currents in the rod conductors 39 to be approximately equal. As a result, the coil 9 which has only a two-fold symmetry (relative to the symmetry plane 35) from a geometrical point of view behaves as a coil having a four-fold symmetry from an electrical point of view, the reference plane 37 then also acting as the symmetry plane. Consequently, the coil 9 has two resonant modes with equal resonant frequencies and an approximately equal current in all rod conductors 39. It has been found that this situation can be achieved when the capacitance of the capacitive elements 49 in series with the rod conductors 39 near the symmetry plane 35 is higher than the capacitance of the capacitive elements connected in series with the rod conductors near the reference plane 37. The positions of the symmetry plane 35 and the reference plane 37 are indicated in FIG. 3 for the purpose of orientation. The exact values of the capacitive elements 49 can be simply adjusted by means of the variable capacitors 53. A suitable choice of the capacitances of the capacitive elements 47 in the loop conductor 41 can contribute to the currents in the rod conductors 39 becoming approximately equal. If desired, these capacitive elements may also comprise variable capacitors.

The coil 9 comprises first and second connection means 55 and 57 which each consist of a pair of connection terminals in the present embodiment, one terminal being connected to an electrode of one of the capacitors 51 whereas the other terminal is connected to the other electrode of said capacitor. The connection means 55 and 57 can instead be connected, if desired, to a (capacitive and/or inductive) portion of the loop conductor 41 or be inductively coupled to one of the rod conductors 39 or a portion of the loop conductor 41. The first connection means 55 are connected to the capacitor 51 which is connected in series with the longest rod conductor 39 (the lower conductor in the FIGS. 2A and 2B) and the second connection means 57 are connected to the capacitor which is connected in series with one of the shortest rod conductors (the extreme left conductor in FIG. 2B). The first connection means 55 are connected, to the previously mentioned signal amplifier 13 via first switching means 59, and the second connection means 57 are connected thereto via second switching means 61. In the connections between the connection means 55 and/or 57 and the signal amplifier 13 there may also be inserted, if desired, RF decoupling means (not shown) for decoupling the two read-out points for RF currents. Together with the detector 15 and the central control device 17, the signal amplifier 13 forms part of receiver means which are operative to receive the two resonant modes of the coil 9. The signal associated with the first resonant mode is extracted via the first connection means 55 and the signal associated with the second resonant mode is extracted via the second connection means 57. The connection between one of the two connection means 55, 57 and the signal amplifier 13 can be interrupted by means of the switching means 59, 61. This may be advantageous so as to improve the signal-to-noise ratio, for example when a measuring zone situated in the vicinity of the left-hand end of the coil 9 in FIG. 2A is chosen by means of the gradient coils 3. In that zone the contribution by the two resonant modes is very unequal, so that the signal-to-noise ratio is adversely affected in the case of quadrature read-out. The signal-to-noise ratio can then be improved through linear readout where only the signal of one of the resonant modes is processed by the signal amplifier 13. The switching means 59, 61 can be controlled by the central control device 17. Evidently, they can also be constructed so as to render the receiver means insensitive to one of the two resonant modes other than by interruption of a connection. When the coil 9 is used as a transmitter coil, evidently the connection means 55, 57 will be connected, via the switching means 59, 61, to the RF source 11 operative to excite the two resonant modes. If desired, there may also be provided switching means (not shown) enabling the use of the coil for transmission as well as reception.

I claim:

1. A magnetic resonance apparatus, comprising a mainly cylindrical RF coil having a longitudinally directed central axis and a mutually perpendicular symmetry plane and reference plane which intersect each other along the central axis, and also comprises a plurality of rod conductors which extend parallel to the central axis across a mainly cylindrical surface, and loop conductors which extend around the central axis near the ends of the rod conductors, said plurality of rod conductors including rod conductors which are situated diametrically near the symmetry plane on opposite sides of the reference plane and rod conductors which are situated diametrically near the reference plane on opposite sides of the symmetry plane, the reference plane on opposite sides of the symmetry plane, the rod conductors situated near the symmetry plane on opposite sides of the reference plane being longer than the rod conductors situated near the reference plane on opposite sides of the symmetry plane, and the rod conductors situated near the symmetry plane on one side of the reference plane being longer than the rod conductors situated near the symmetry plane on the other side of the reference plane.

2. A magnetic resonance apparatus as claimed in claim 1, wherein a distance between rod conductors situated near the reference plane on opposite sides of the symmetry plane is smaller than a distance between rod conductors situated near the symmetry plane on opposite sides of the reference plane.

3. A magnetic resonance apparatus as claimed in claim 1, characterized in that at least one capacitive element is connected in series with each rod conductor, such that a capacitance in series with each of the rod conductors near the symmetry plane is greater than a capacitance in series with each of the rod conductors near the reference plane.

4. A magnetic resonance apparatus as claimed in claim 1, in which the RF coil comprises first and second connection means for connecting the RF coil to transmitter or receiver means for excitation or reception, respectively utilizing first and second resonant modes of the RF coil, further comprising switching means for selectively deactivating a connection between one of the two connection means and the transmitter or receiver means.

5. An RF coil suitable for use in a magnetic resonance apparatus, said coil being mainly cylindrical, having a longitudinally directed central axis and a mutually perpendicular symmetry plane and reference plane which intersect each other along the central axis, and also comprises a plurality of rod conductors which extend parallel to the central axis across a mainly cylindrical surface, and loop conductors which extend around the central axis near the ends of the rod conductors, said plurality of rod conductors including rod conductors which are situated diametrically near the symmetry plane on opposite sides of the reference plane and rod conductors which are situated diametrically near the reference plane on opposite sides of the symmetry plane, the rod conductors situated near the symmetry plane on opposite sides of the reference plane being longer than the rod conductors situated near the reference plane on opposite sides of the symmetry plane, and the rod conductors situated near the symmetry plane on one side of the reference plane being longer than the rod conductors situated near the symmetry plane on the other side of the reference plane.

6. A magnetic resonance apparatus as claimed in claim 2, characterized in that at least one capacitive element is connected in series with each rod conductor, such that a capacitance in series with each of the rod conductors near the symmetry plane is greater than a capacitance in series with each of the rod conductors near the reference plane.

7. A magnetic resonance apparatus as claimed in claim 6, in which the RF coil comprises first and second connection means for connecting the RF coil to transmitter or receiver means for excitation or reception, respectively, utilizing first and second resonant modes of the RF coil, further comprising switching means for selectively deactivating a connection between one of the two connection means and the transmitter or receiver means.

* * * * *